United States Patent
Hou et al.

(10) Patent No.: US 11,361,809 B2
(45) Date of Patent: Jun. 14, 2022

(54) PSEUDO STATIC MEMORY DEVICE

(71) Applicant: Winbond Electronics Corp., Taichung (TW)

(72) Inventors: Chien-Ti Hou, Taichung (TW); Ying-Te Tu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/324,115

(22) Filed: May 19, 2021

(65) Prior Publication Data
US 2022/0020425 A1 Jan. 20, 2022

(30) Foreign Application Priority Data
Jul. 20, 2020 (TW) ................................. 109124457

(51) Int. Cl.
*G11C 7/00* (2006.01)
*G11C 11/406* (2006.01)

(52) U.S. Cl.
CPC .............................. *G11C 11/40615* (2013.01)

(58) Field of Classification Search
CPC .................................................. G11C 11/40615
USPC ......................................................... 365/222
See application file for complete search history.

(56) References Cited

U.S. PATENT DOCUMENTS

| 7,778,099 B2 | 8/2010 | Fujioka | |
|---|---|---|---|
| 2005/0169091 A1* | 8/2005 | Miki | G11C 11/40615 365/230.03 |
| 2006/0274591 A1* | 12/2006 | Fujioka | G11C 7/1045 365/222 |

* cited by examiner

*Primary Examiner* — Huan Hoang
(74) *Attorney, Agent, or Firm* — JCIPRNET (57) ABSTRACT

A pseudo static memory device includes multiple memories, an arbiter and a controller. The memories respectively generate multiple self-refresh request signals. Each of the self-refresh request signals indicates a time period for performing self-refresh operation of corresponding memory. The arbiter receives the self-refresh request signals and generates a latency synchronize flag during the memories being enabled. The controller decides an accessing latency for accessing the memories during an accessing operation according to the latency synchronize flag.

13 Claims, 8 Drawing Sheets

PSEUDO STATIC MEMORY DEVICE

CROSS-REFERENCE TO RELATED APPLICATION

This application claims the priority benefit of Taiwan application serial no. 109124457, filed on Jul. 20, 2020. The entirety of the above-mentioned patent application is hereby incorporated by reference herein and made a part of this specification.

BACKGROUND

1. Technical Field

The disclosure relates to a pseudo static memory device, and particularly relates to a pseudo static memory device that is capable of dynamically adjusting an accessing latency.

2. Description of Related Art

In electronic devices that require static memory, a pseudo static memory device using dynamic random access memory has been proposed because of the increasing capacity of the static memory required. The pseudo static memory device is popular especially in IoT devices.

The dynamic random access memory needs to perform self-refresh operations, therefore, when the dynamic random access memory performs a self-refresh operation while the pseudo static memory device is performing an accessing operation, the dynamic random access memory can provide access data only after a certain long accessing latency. To deal with this problem, a mechanism of adjustable accessing latency was proposed.

However, the above-mentioned mechanism of adjustable accessing latency can only be applied to the architecture of a single dynamic random access memory. In order to increase the data width and the storage density, multiple dynamic random access memories often need to be configured in a pseudo static memory device, in which the above-mentioned mechanism of the adjustable accessing latency is not applicable because each dynamic random access memory performs the self-refresh at a different time. Therefore, in conventional technology, a fixed and long enough accessing latency is set for a pseudo static memory device with multiple dynamic random access memories to perform an accessing operation. As a result, the access rate of the pseudo static memory device is subject to certain restrictions.

SUMMARY

The disclosure provides a pseudo static memory device that is capable of dynamically adjusting a memory accessing latency and improving use efficiency.

A pseudo static memory device of the disclosure includes multiple memories, an arbiter and a controller. The memories respectively generate multiple self-refresh request signals. Each of the self-refresh request signals indicates a time period during which a corresponding each of the memories performs a self-refresh operation. The arbiter receives the self-refresh request signals and generates a latency synchronize flag during the memories being enabled. The controller is coupled to the memories and the arbiter. The controller decides an accessing latency for accessing the memories during an accessing operation according to the latency synchronize flag.

Based on the above, the pseudo static memory device of the present embodiment of the disclosure decides whether a collision of time occurs in at least one of the memories during self-refresh operation when the memory device is performing an accessing operation, and dynamically adjusts the accessing latency of the memory according to the decision, and effectively improves the performance of the pseudo static memory device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the exemplary embodiments of the disclosure, examples of which are illustrated in the accompanying drawings. Wherever possible, the same reference numbers are used in the drawings and the description to refer to the same or like parts.

Figure 1:
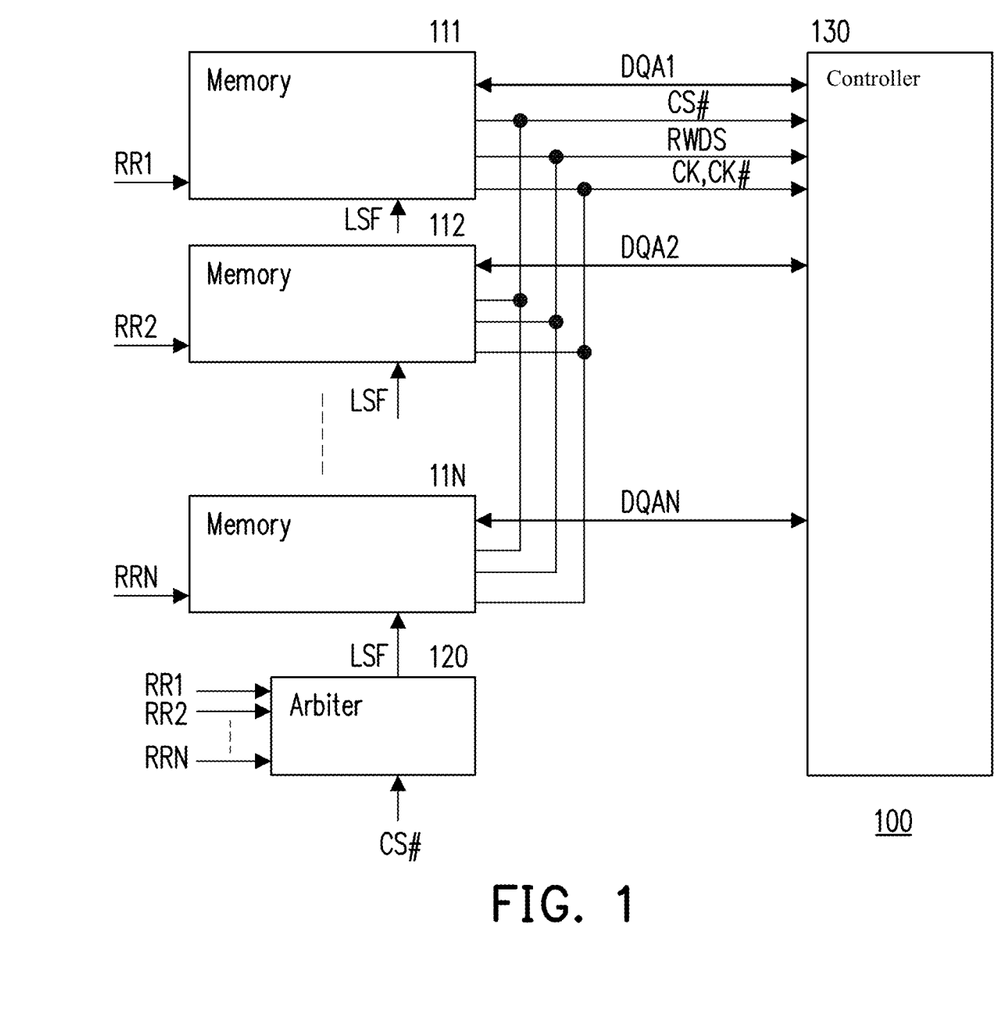
FIG. 1 is a schematic diagram of a pseudo static memory device according to an embodiment of the disclosure.

Please refer to FIG. 1. FIG. 1 is a schematic diagram of a pseudo static memory device according to an embodiment of the disclosure. A pseudo static memory device 100 includes memories 111-11N, an arbiter 120, and a controller 130. The memories 111-11N are dynamic random access memories. The memories 111-11N generate multiple self-refresh request signals RR1-RRN, and each of the self-refresh request signals RR1-RRN indicates a time period during which a corresponding each of the memories 111-11N performs a self-refresh operation. The self-refresh request signals RR1-RRN are provided to the arbiter 120. The arbiter 120 receives a chip enable signal CS#. The arbiter 120 further generates a latency synchronize flag LSF according to the self-refresh request signals RR1-RRN at an activation time point of an activation time period of a memory. Specifically, when the chip enable signal CS# is not enabled, the arbiter 120 may obtain, through the self-refresh request signals RR1-RRN, during a standby time period when the memories 111-11N are not activated for access, the time period during which each of the memories 111-11N performs the self-refresh operation. At a time point when the chip enable signal CS# transitions to be enabled (that is, the activation time point of the activation time period), the arbiter 120 may decide, according to the self-refresh request signals RR1-RRN, whether any one of the memories 111-11N is still performing the self-refresh operation. If the conclusion is yes, an enabled latency synchronize flag LSF is generated; if the conclusion is no, a disabled latency synchronize flag LSF is generated.

The arbiter 120 may transmit the latency synchronize flag LSF to the memories 111-11N such that the memories 111-11N generate an accessing latency indication signal RWDS according to the latency synchronize flag LSF. Please note here that terminals of the memories 111-11N for generating the accessing latency indication signal RWDS are coupled to a same transmission wire; in other words, the memories 111-11N jointly generate the same accessing latency indication signal RWDS.

The controller 130 is coupled to the memories 111-11N and receives the accessing latency indication signal RWDS, the chip enable signal CS#, a clock signal CK, and a reverse clock signal CK# that are jointly generated by the memories 111-11N. During an accessing operation, the controller 130 also receives data signals DQA1-DQAN respectively provided by the memories 111-11N.

In addition, during the accessing operation, the controller 130 may set an accessing latency according to the accessing latency indication signal RWDS provided by the memories 111-11N and obtain the data signals DQA1-DQAN according to the set accessing latency. The accessing operation of the present embodiment may be a data read operation or a data write operation.

From the above description, it is not difficult to know that the arbiter 120 of the present embodiment of the disclosure may decide whether a collision of time occurs between the self-refresh operations of the memories 111-11N and the time period in which the memories 111-11N are enabled. According to the decision of the arbiter 120, the pseudo static memory device 100 of the present embodiment may dynamically adjust the accessing latency of the accessing operation through the accessing latency indication signal RWDS generated by the memories 111-11N, thereby improving the working performance of the pseudo static memory device 100.

Incidentally, the arbiter 120 may be configured in each of the memories 111-11N or may also be configured outside the memories 111-11N, without specific restrictions. The memories 111-11N may be respectively implemented by multiple dynamic random access memory chips. In addition, the controller 130 of the present embodiment of the disclosure may be a processor with computing capability. Alternatively, the controller 130 may be a hardware circuit designed through a hardware description language (HDL) or any other digital circuit design method known to those with ordinary knowledge in the art, and may be implemented through a field programmable gate array (FPGA), a complex programmable logic device (CPLD) or an application-specific integrated circuit (ASIC).

Figure 2A:
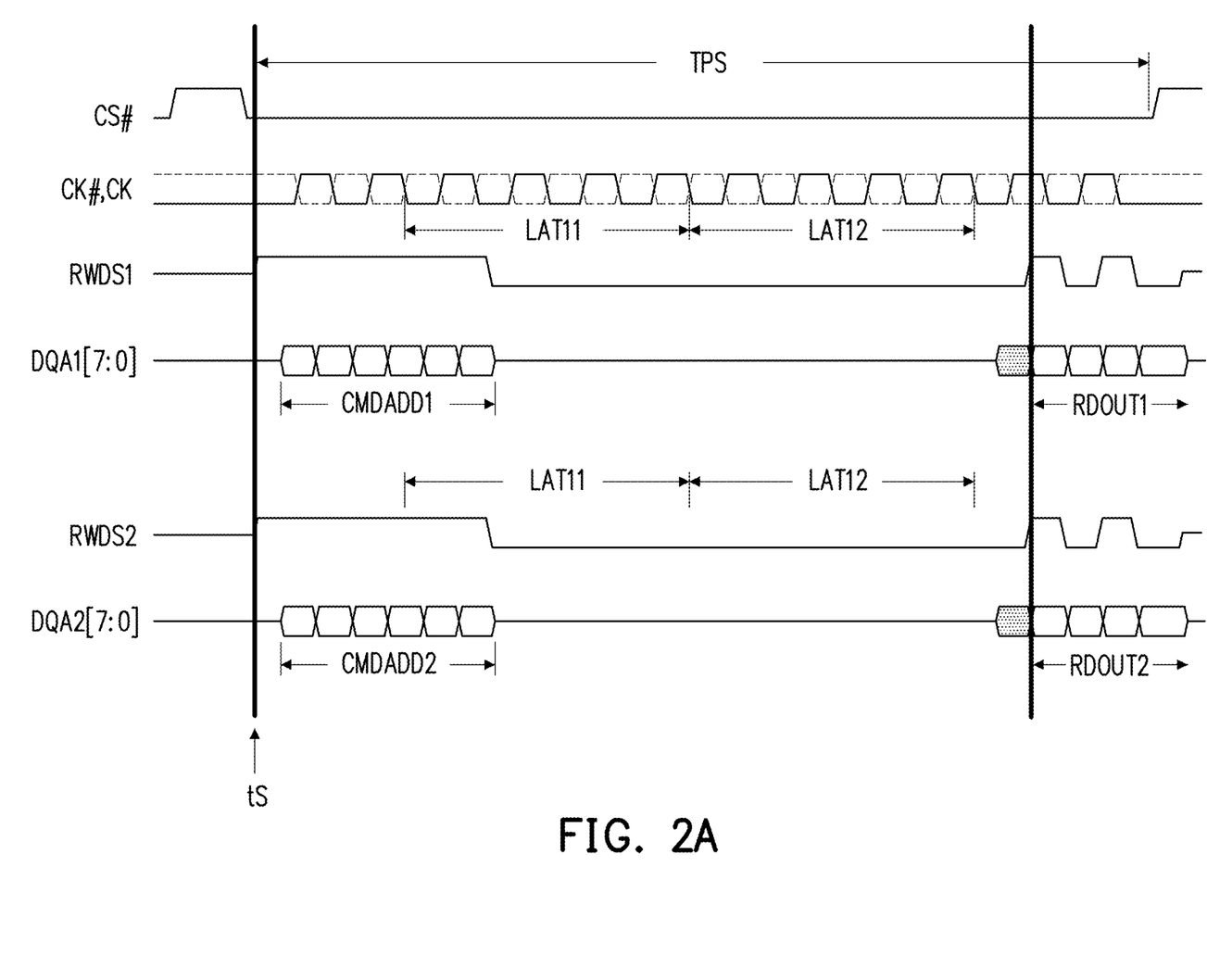
FIG. 2A and FIG. 2B are waveform diagrams illustrating read operations of different implementations of a pseudo static memory device according to an embodiment of the disclosure.
Figure 2B:
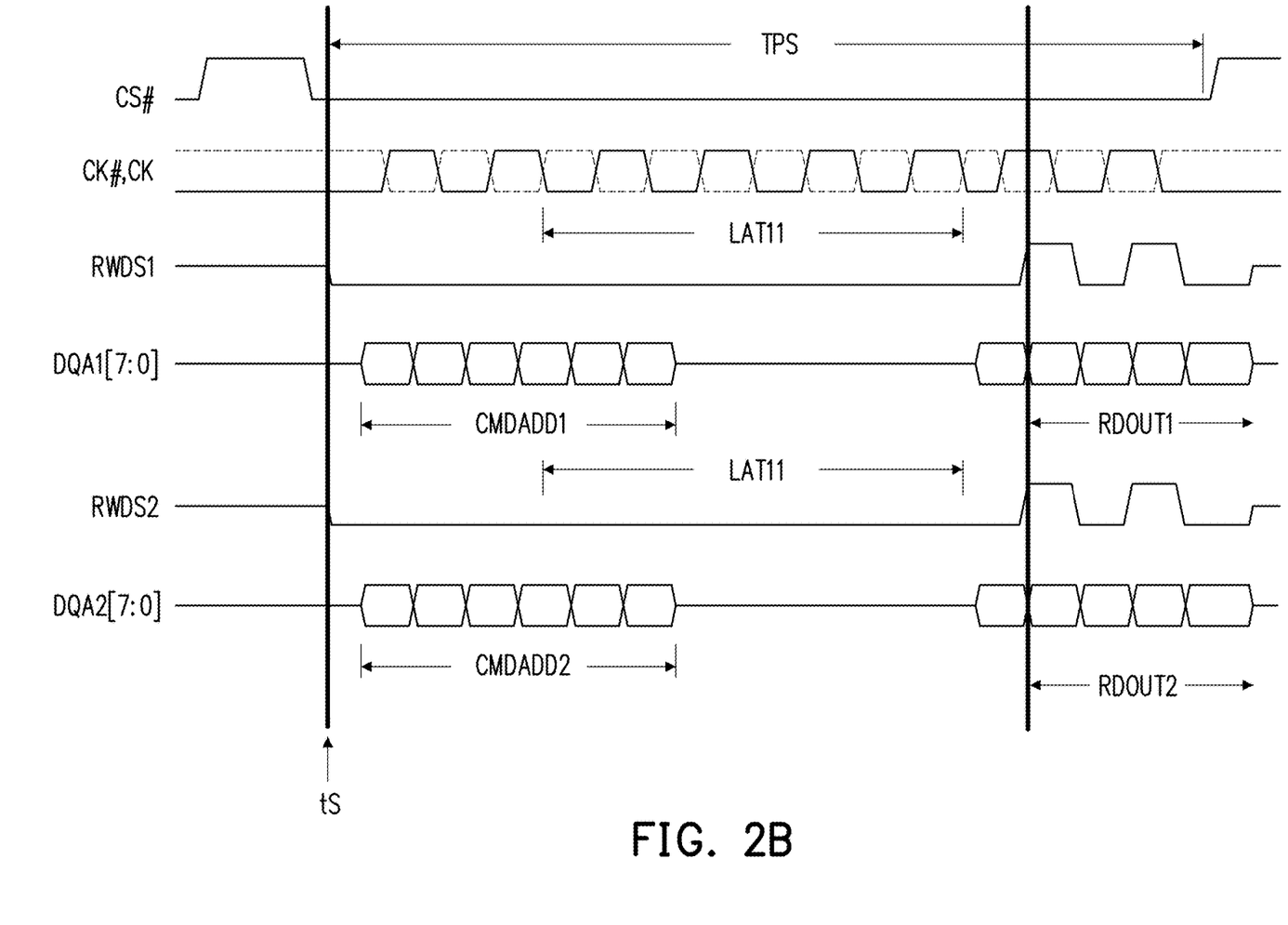

Please refer to FIG. 2A and FIG. 2B. FIG. 2A and FIG. 2B are waveform diagrams illustrating read operations of different implementations of a pseudo static memory device according to an embodiment of the disclosure. In FIG. 2A, the pseudo static memory device includes a first memory and a second memory, for example. The first memory and the second memory share the chip enable signal CS#, in which the chip enable signal CS# is a low active signal. When the chip enable signal CS# is at logic high level, multiple memories in the pseudo static memory device are in the standby time period.

In the standby time period, the first memory and the second memory in the pseudo static memory device need to periodically perform self-refresh operations to respectively generate the multiple self-refresh request signals according to the time period during which the self-refresh operations occur.

When the chip enable signal CS# transitions to logic low level, the memories in the pseudo static memory device are all enabled and enter an activation time period TPS. At this time, an arbiter in the pseudo static memory device may generate an accessing latency indication signal RWDS according to the self-refresh request signals. In detail, at an activation time point tS of the activation time period TPS, if the arbiter decides that at least one of the first memory and the second memory in the pseudo static memory device is still performing a self-refresh operation, the arbiter may conclude that there is a collision of time between the self-refresh operation of the memory and the accessing operation, thereby enabling the latency synchronize flag.

Moreover, according to the enabled latency synchronize flag, the first memory and the second memory may respectively generate an accessing latency indication signal RWDS1 and an accessing latency indication signal RWDS2 that are at logic high level. In the present embodiment, the accessing latency indication signal RWDS1 and the accessing latency indication signal RWDS2 may be transmitted to the same transmission wire to be the same signal.

On the other hand, in the activation time period TPS, the first memory may receive a data signal DQSA1[7:0] to obtain a command and address CMDADD1, and the second memory may receive a data signal DQSA2[7:0] to obtain a command and address CMDADD2. When the controller decides, according to the command and address CMDADD1 and the command and address CMDADD2, to perform a data read operation on the first memory and the second memory, the controller may set the accessing latency of the first memory to be latency LAT11+latency LAT12 according to the latency indication signal RWDS1 that is at logic high level; set the accessing latency of the second memory to be latency LAT11+latency LAT12 according to the accessing latency indication signal RWDS2 that is at logic high level; and obtain an access data RDOUT1 from the first memory and an access data RDOUT2 from the second memory after the accessing latency. Specifically, in the present embodiment of the disclosure, the controller may perform the data read operation according to a set bit in the command and address CMDADD1 and a set bit in the command and address CMDADD2.

In the present embodiment, the latency LAT11 and the latency LAT12 may be the same.

Incidentally, the activation time period TPS ends when the chip enable signal CS# transitions to logic high level. The operation of the present embodiment may be performed based on the clock signal CK and the reverse clock signal CK# which are differential signals with respect to each other.

In FIG. 2B, with a different implementation method from FIG. 2A, the arbiter decides at the activation time point tS that neither the first memory nor the second memory is performing the self-refresh operation, thereby disabling the latency synchronize flag. Under such condition, according to the disabled latency synchronize flag, during the accessing operation, the first memory and the second memory respectively generate the latency indication signal RWDS1 and the latency indication signal RWDS2 that are at logic low level.

Further, the controller may set the accessing latency of the first memory and the second memory to be latency LAT11 according to the accessing latency indication signal RWDS1 and the accessing latency indication signal RWDS2 that are at logic low level. In other words, when there is no collision of time between the self-refresh operation of the memory and the accessing operation, the controller may reduce the accessing latency of the first memory and the second memory.

Incidentally, in the present embodiment, by configuring the first memory and the second memory in the pseudo static memory device, the width of a data signal that can be accessed may be expanded to N times that of a single memory, in which N is an integer greater than or equal to 2, thereby improving the use efficiency.

Figure 2C:
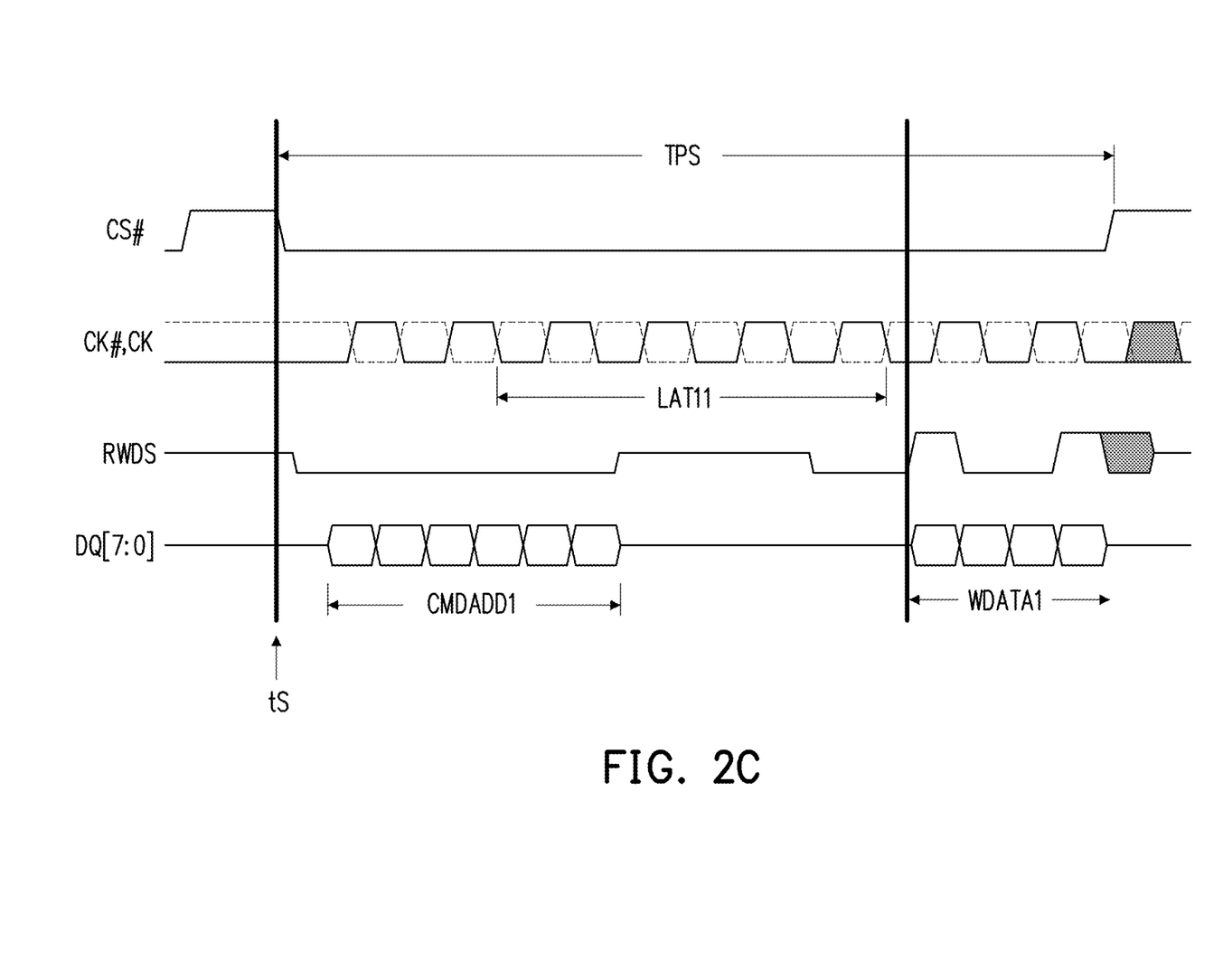
FIG. 2C and FIG. 2D are waveform diagrams illustrating write operations of different implementations of a pseudo static memory device according to an embodiment of the disclosure.
Figure 2D:
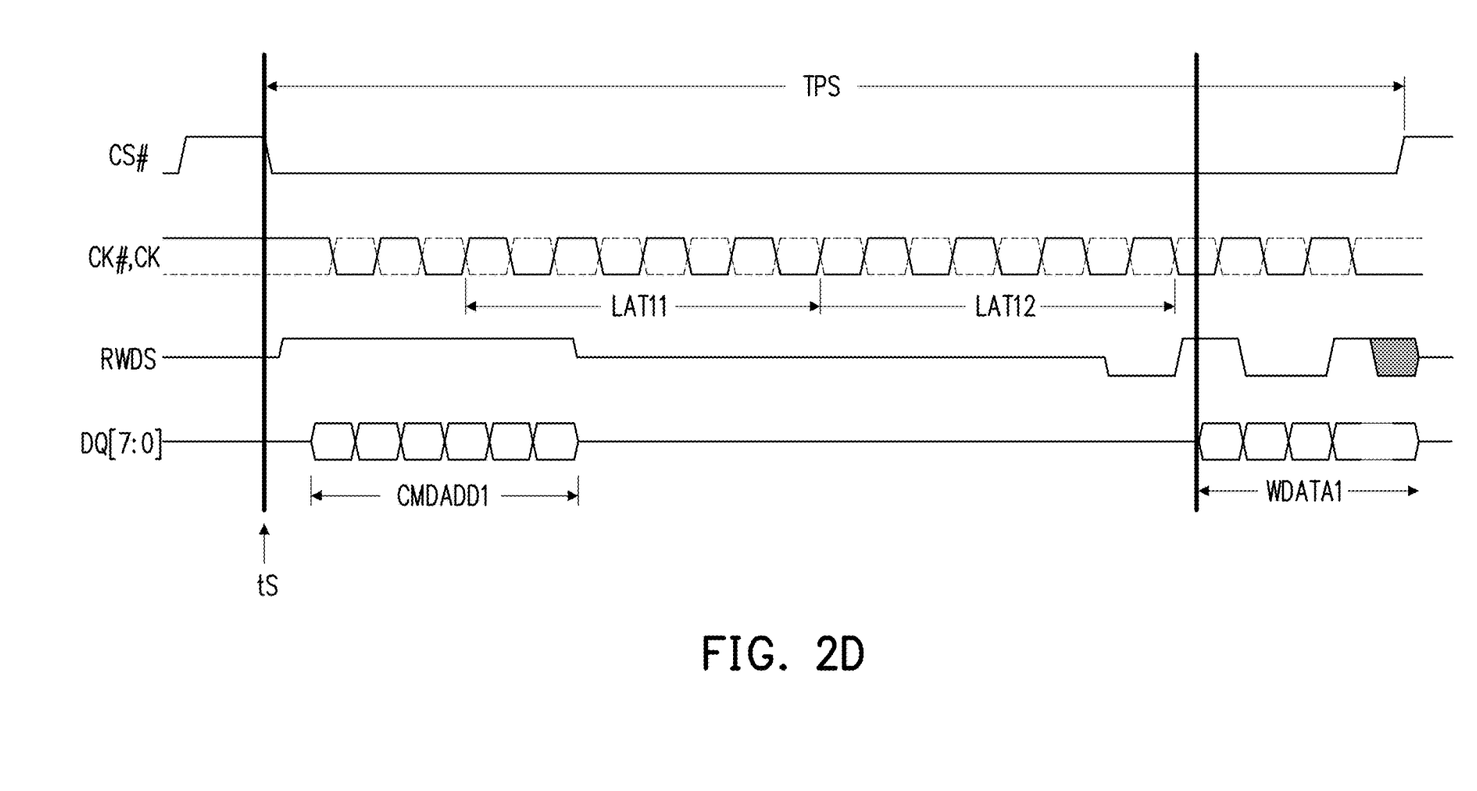

Please refer to FIG. 2C and FIG. 2D. FIG. 2C and FIG. 2D are waveform diagrams illustrating write operations of different implementations of a pseudo static memory device according to an embodiment of the disclosure.

In FIG. 2C, when the chip enable signal CS# transitions to logic low level, the memories in the pseudo static memory device are all enabled and enter the activation time period TPS. At this time, the arbiter in the pseudo static memory device may generate an accessing latency indication signal RWDS according to the self-refresh request signals. In detail, at the activation time point tS of the activation time period TPS, if the arbiter decides that a self-refresh operation of any memory (such as the first memory) in the pseudo static memory device is still performing, the arbiter may conclude that there is a collision of time between the self-refresh operation of the memory and the accessing operation, thereby enabling the latency synchronize flag.

Moreover, according to the enabled latency synchronize flag, the first memory may generate an accessing latency indication signal RWDS1 that is at logic high level. In the present embodiment, the accessing latency indication signal RWDS1 may be transmitted to a transmission wire, and the accessing latency indication signals of other memories are the same with the accessing latency indication signal RWDS1.

On the other hand, in the activation time period TPS, the first memory may receive the data signal DQSA1[7:0] to obtain the command and address CMDADD1. When the controller decides according to the command and address CMDADD1 to perform the data write operation on the first memory, the controller may set the accessing latency of the first memory to be latency LAT11+latency LAT12 according to the accessing latency indication signal RWDS1 that is at logic high level, and perform the write operation of a write data WDATA1 on the first memory after the accessing operation. Specifically, in the present embodiment of the disclosure, the controller may perform the data read operation according to a set bit in the command and address CMDADD1.

On the other hand, in FIG. 2D, at the activation time point tS, the arbiter decides that neither the first memory nor other memories is performing the self-refresh operation, thereby disabling the latency synchronize flag. Under such condition, according to the disabled latency synchronize flag, the first memory generates the latency indication signal RWDS1 that is at logic low level. Further, during the accessing operation, the controller may set the accessing latency of the first memory to be latency LAT11 according to the accessing latency indication signal RWDS1 that is at logic low level. In other words, when there is no collision of time between the self-refresh operation of the memory and the accessing operation, the controller may reduce the accessing latency of the first memory.

Figure 3:
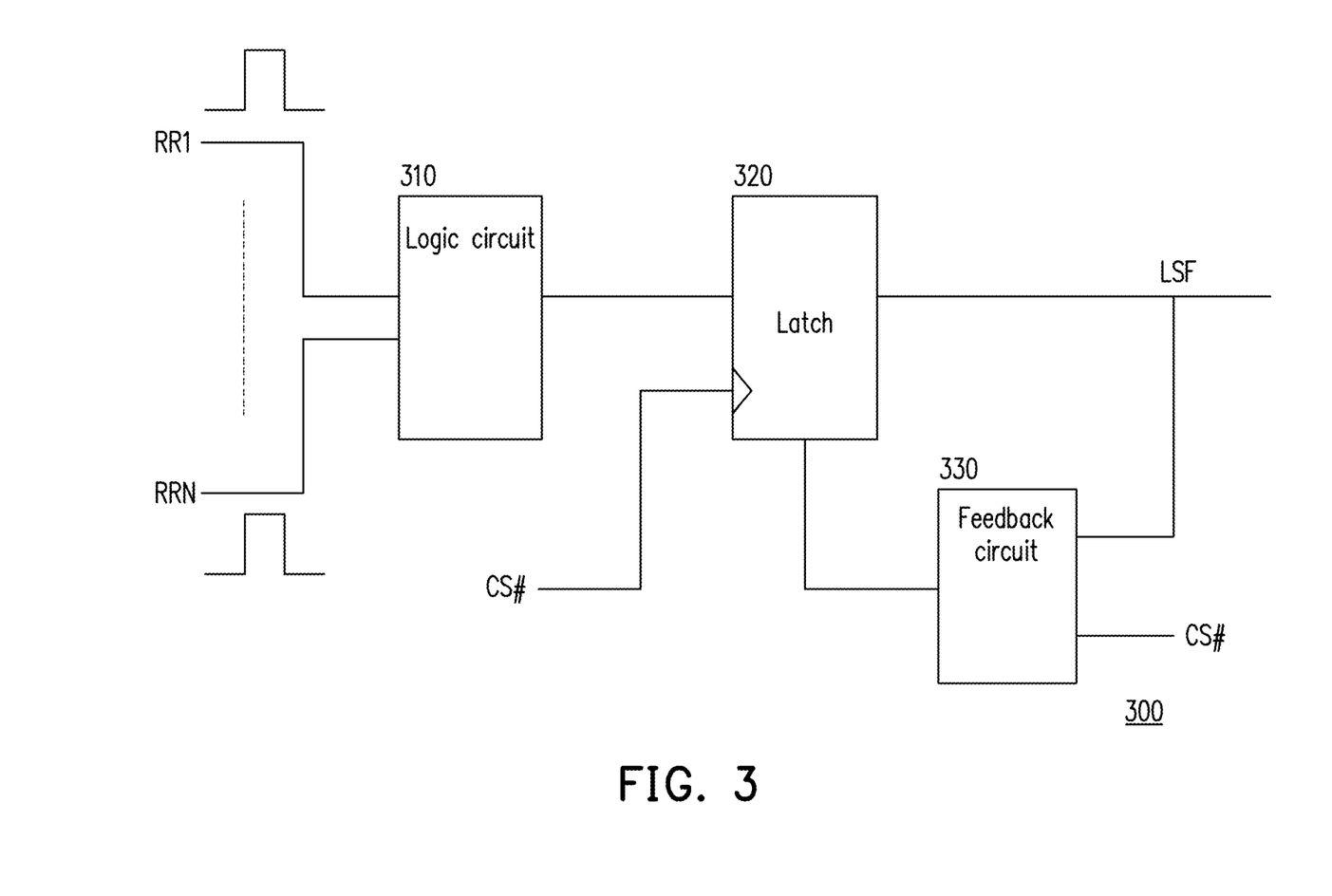
FIG. 3 is a schematic diagram of an implementation of an arbiter according to an embodiment of the disclosure.

Please refer to FIG. 3. FIG. 3 is a schematic diagram of an implementation of an arbiter according to an embodiment of the disclosure. An arbiter 300 includes a logic circuit 310, a latch 320, and a feedback circuit 330. The logic circuit 310 receives the self-refresh request signals RR1-RRN respectively generated by the multiple memories and performs a logic operation on the self-refresh request signals, thereby generating an operation result OPR.

In the present embodiment, the self-refresh request signals RR1-RRN may be pulse signals configured to reflect the time periods during which the memories perform the self-refresh operations. Taking the self-refresh request signal RR1 as an example, when the self-refresh request signal RR1 is raised to logic high level, it indicates that the corresponding memory is performing a self-refresh operation. Also, a positive pulse length of the self-refresh request signal RR1 indicates the length of time the self-refresh operation is maintained. When the self-refresh request signal RR1 is lowered to logic low level, it indicates that the self-refresh operation of the corresponding memory is completed.

In the present embodiment, the logic circuit 310 may be an OR gate, and is configured to perform a logic OR operation. Moreover, the logic circuit 310 generates the operation result OPR that is at logic high level when at least one of the self-refresh request signals RR1 to RRN is at logic high level. In other words, when the operation result OPR is at logic high level, at least one of the multiple memories in the pseudo static memory device is performing the self-refresh operation.

The latch 320 receives the operation result OPR to latch the operation result OPR, and provides a latched operation result OPR according to the transition time point of the chip enable signal CS# to generate the latency synchronize flag LSF. The transition time point of the chip enable signal CS# is the activation time point of the activation time period at which the memory is enabled.

The feedback circuit 330 receives the latency synchronize flag LSF and the chip enable signal CS#. The feedback circuit 330 is configured to provide a reset signal to clear the latch 320 data when the latency synchronize flag LSF and the chip enable signal CS# are both at logic high level. In the present embodiment, the feedback circuit 330 may be an AND gate or an NAND gate. The reset signal that the latch 320 receives may be high active or low active.

Figure 4:
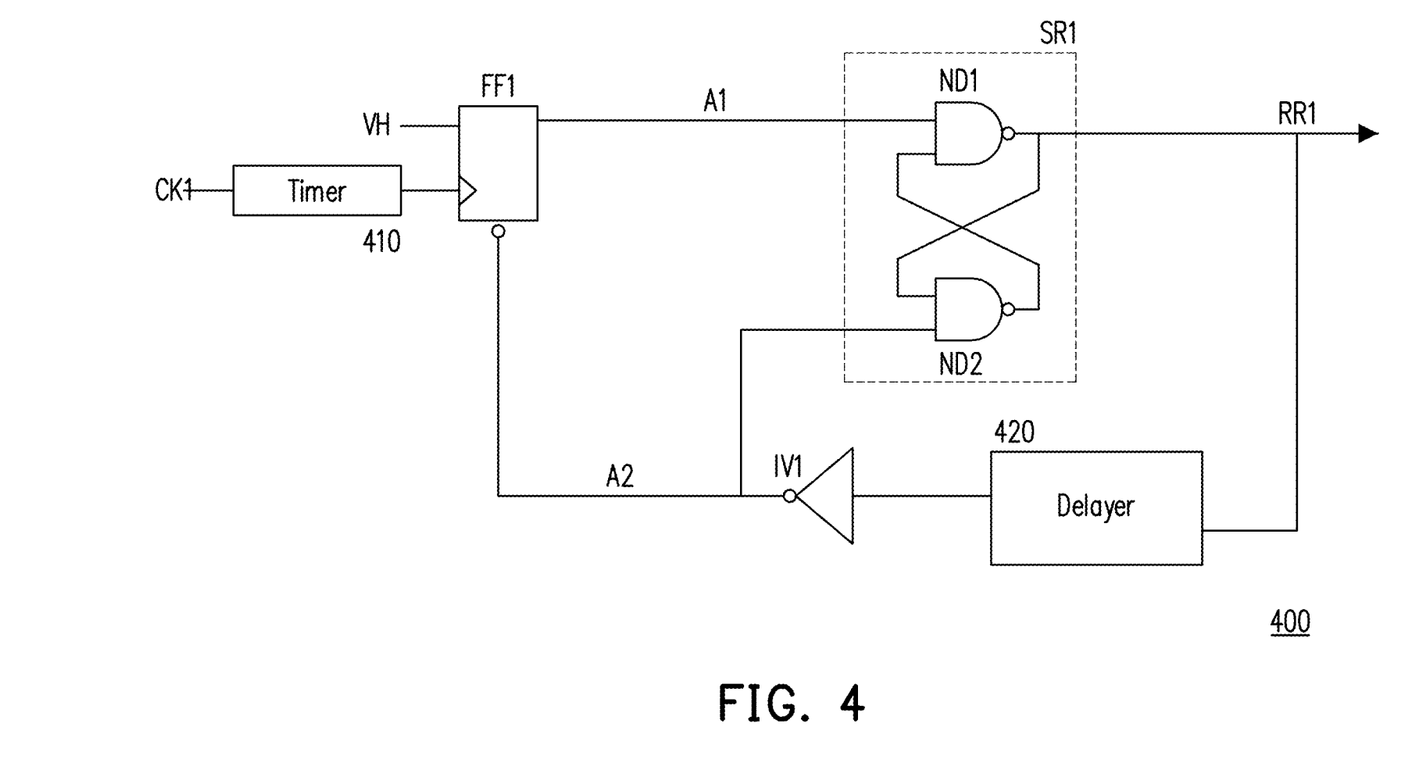
FIG. 4 is a schematic diagram of an implementation of a part of a circuit of a memory according to an embodiment of the disclosure.

Please refer to FIG. 4. FIG. 4 is a schematic diagram of an implementation of a part of a circuit of a memory according to an embodiment of the disclosure. In the present embodiment of the disclosure, a memory 400 in the pseudo static memory device includes a timer 410 and a delayer 420. The timer 410 performs a timing according to a clock signal CK1 and enables the corresponding self-refresh request signal at logic high level after the timing overflows. The delayer 420 is configured to control the length of time during which the self-refresh request signal RR is enabled, such that the self-refresh request signal RR is disabled after maintaining at logic high level for a preset time (that is, transitioned to logic low level).

In the present embodiment, the timer 410 is coupled to a flip-flop FF1. The flip-flop FF1 may generate a signal A1 that is at logic high level according to a voltage VH after the timing of the timer 410 overflows. A latch SR1 receives the signal A1 and a signal A2, and outputs the self-refresh request signal RR1. The signal A2 is generated by an inverter IV1 after the delayer 420 delays the self-refresh request signal RR1 for a preset time. The latch SR1 may include an NAND gate ND1 and an NAND gate ND2, and may be a set-reset latch (SR-latch).

The signal A2 is also provided to a reset terminal of the flip-flop FF1, and when the signal A2 is at logic low level, the flip-flop FF1 may reset the signal A2 to logic low level.

Figure 5:
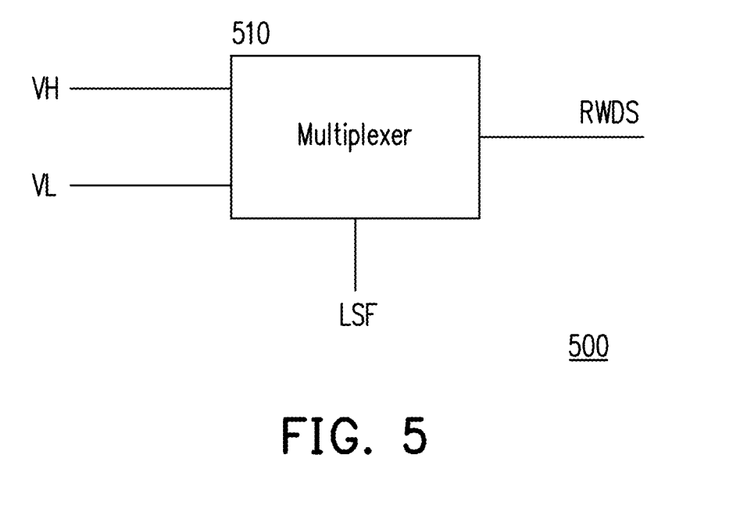
FIG. 5 is a schematic diagram of an implementation of another part of a circuit of a memory according to the embodiment of the disclosure.

Please refer to FIG. 5. FIG. 5 is a schematic diagram of an implementation of another part of a circuit of a memory according to the embodiment of the disclosure. A memory 500 in the pseudo static memory device includes a multiplexer 510. The multiplexer 510 receives the voltage VH and a voltage VL, in which the voltage VH may be at logic high level and voltage VL may be at logic low level. The multiplexer 510 further receives the latency synchronize flag LSF, and decides to output the voltage VH or the voltage VL according to the latency synchronize flag LSF so as to generate the accessing latency indication signal RWDS.

In the present embodiment, when the latency synchronize flag LSF is enabled (a collision of time occurs between the self-refresh operation and the accessing operation), the multiplexer 510 may select the voltage VH to generate the accessing latency indication signal RWDS; in contrast, when the latency synchronize flag LSF is disabled (no collision of time occurs between the self-refresh operation and the accessing operation), the multiplexer 510 may select the voltage VL to generate the accessing latency indication signal RWDS.

In summary, the pseudo static memory device of the disclosure provides an arbitration mechanism to decide the self-refresh operations of multiple memories in the pseudo static memory device and the collision status of the accessing operation of the pseudo static memory device, and dynamically adjusts the accessing latency accordingly. In this way, a dynamic read latency can still be implemented in the pseudo static memory device with multiple memories, and the performance of the pseudo static memory device can be improved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A pseudo static memory device, comprising:
   a plurality of memories respectively generating a plurality of self-refresh request signals, each of the self-refresh request signals indicating a time period during which a corresponding each of the memories performs a self-refresh operation;
   an arbiter receiving the self-refresh request signals, generating a latency synchronize flag according to the self-refresh request signals during the memories being enabled; and
   a controller coupled to the memories and the arbiter, deciding an accessing latency for accessing the memories during an accessing operation according to the latency synchronize flag.

2. The pseudo static memory device according to claim 1, wherein each of the memories sets each of the corresponding self-refresh request signals at a first logic level in a time period during which the self-refresh operation is performed.

3. The pseudo static memory device according to claim 2, wherein, in a standby time period before an activation time period, the arbiter performs a logic operation on the self-refresh request signals to generate an operation result, and outputs the operation result at an activation time point of the activation time period during which the memories are enabled to generate the latency synchronize flag.

4. The pseudo static memory device according to claim 3, wherein when the first logic level is at logic high level, the logic operation is a logic OR operation.

5. The pseudo static memory device according to claim 3, wherein the arbiter latches the operation result at the activation time point to generate the latency synchronize flag.

6. The pseudo static memory device according to claim 3, wherein the arbiter comprises:
   a logic circuit receiving the self-refresh request signals, performing the logic operation on the self-refresh request signals to generate the operation result; and
   a latch coupled to the logic circuit, latching the operation result at the activation time point according to a chip enable signal and outputting the latency synchronize flag according to the operation result.

7. The pseudo static memory device according to claim 6, wherein the arbiter further comprises:
   a feedback circuit coupled to the latch, receiving the latency synchronize flag and the chip enable signal so as to clear the operation result in the standby time period according to the latency synchronize flag.

8. The pseudo static memory device according to claim 6, wherein the memories jointly receive the chip enable signal.

9. The pseudo static memory device according to claim 1, wherein the memories respectively generate a same plurality of accessing latency indication signals according to the latency synchronize flag, and the controller decides the accessing latency during the accessing operation according to the accessing latency indication signals.

10. The pseudo static memory device according to claim 9, wherein each of the memories comprises:
    a multiplexer selecting a first voltage or a second voltage according to the latency synchronize flag to generate the accessing latency indication signal,
    wherein the first voltage is different from the second voltage.

11. The pseudo static memory device according to claim 10, wherein when the accessing latency indication signal is a first signal, the accessing latency is a first length, and when the accessing latency indication signal is a second signal, the accessing latency is a second length, wherein the second length is N times the first length, and N is an integer greater than or equal to 2.

12. The pseudo static memory device according to claim 1, wherein each of the memories comprises:
    a timer performing a timing according to a clock signal, enabling the corresponding each of the self-refresh request signals after the timing overflows; and
    a delayer disabling the corresponding each of the self-refresh request signals, wherein the corresponding each of the self-refresh request signals is disabled after maintaining at logic high level for a preset time.

13. The pseudo static memory device according to claim 1, wherein the memories are dynamic random access memories.

* * * * *